(12) United States Patent
Hu et al.

(10) Patent No.: US 8,866,285 B2
(45) Date of Patent: Oct. 21, 2014

(54) FAN-OUT PACKAGE COMPRISING BULK METAL

(75) Inventors: Yen-Chang Hu, Tai-Chung (TW); Chang-Chia Huang, Hsin-Chu (TW); Ching-Wen Hsiao, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/604,239

(22) Filed: Sep. 5, 2012

(65) Prior Publication Data

US 2014/0061937 A1 Mar. 6, 2014

(51) Int. Cl.
*H01L 23/04* (2006.01)
*H01L 23/52* (2006.01)

(52) U.S. Cl.
USPC .............. 257/698; 257/774; 257/E23.011; 438/124

(58) Field of Classification Search
USPC ......... 257/758, 765, 768, 771, 772, 773, 774, 257/787
See application file for complete search history.

(56) References Cited

U.S. PATENT DOCUMENTS

| | | | |
|---|---|---|---|
| 4,807,021 A | 2/1989 | Okumura | |
| 6,335,491 B1 | 1/2002 | Alagaratnam et al. | |
| 7,790,504 B2 | 9/2010 | Ramakrishna et al. | |
| 8,193,646 B2 | 6/2012 | Wood et al. | |
| 2002/0017710 A1 | 2/2002 | Kurashima et al. | |
| 2002/0066952 A1* | 6/2002 | Taniguchi et al. | ............ 257/698 |
| 2003/0013969 A1 | 1/2003 | Erikson et al. | |
| 2007/0013067 A1 | 1/2007 | Nishida et al. | |

* cited by examiner

*Primary Examiner* — Mark Tornow
*Assistant Examiner* — Abbigale Boyle
(74) *Attorney, Agent, or Firm* — Slater & Matsil, L.L.P.

(57) ABSTRACT

A device includes a polymer, a device die in the polymer, and a plurality of Through Assembly Vias (TAVs) extending from a top surface to a bottom surface of the polymer. A bulk metal feature is located in the polymer and having a top-view size greater than a top-view size of each of the plurality of TAVs. The bulk metal feature is electrically floating. The polymer, the device die, the plurality of TAVs, and the bulk metal feature are portions of a package.

19 Claims, 18 Drawing Sheets

FAN-OUT PACKAGE COMPRISING BULK METAL

BACKGROUND

In the packaging of device dies that comprise integrated circuits, device dies may be molded in a molding compound at wafer level, and redistribution lines are formed to connect to the device dies. To mold the device dies in the molding compound, the device dies are first mounted on a glass wafer. The glass wafer, the device dies, and the molding compound in combination are handled as a composite wafer, and are transported. During the process steps performed on the composite wafer, the composite wafer is secured on chuck table the same way as a normal semiconductor wafer.

Due to the significant difference between the Coefficient of Thermal Expansion (CTE) of the molding compound and the CTE of the glass wafer, the composite wafer has warpage. The warpage may be as high as about 1.5 mm or higher. This posts a problem for the tool that picks up the composite wafer and transports it. For example, a suction head may be used to pick up the composite wafer and place it on a chuck table. Due to the warpage, it is difficult to form vacuum between the suction head and the composite wafer, which vacuum is used to attach the composite wafer to the suction head.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package structure and the method of forming the same are provided in accordance with various exemplary embodiments. The intermediate stages of forming the package structure are illustrated. The variations of the embodiments are discussed. Throughout the various views and illustrative embodiments, like reference numbers are used to designate like elements.

Figure 1:
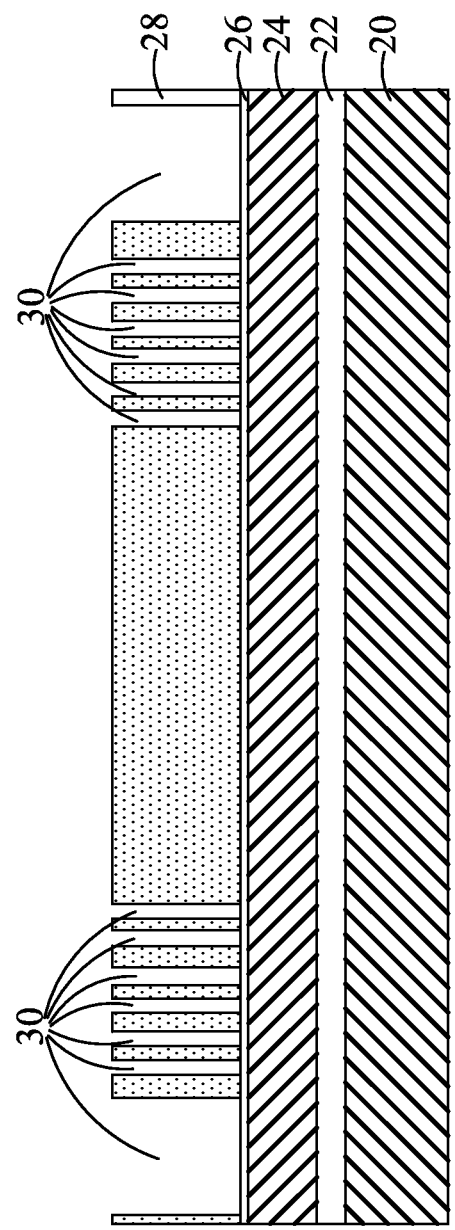
FIGS. 1 through 9 are cross-sectional views of intermediate stages in the manufacturing of a package comprising a device die molded in a polymer in accordance with some exemplary embodiments, wherein a bulk metal feature is formed in the polymer by plating.

FIGS. 1 through 9 are cross-sectional views of intermediate stages in the manufacturing of a package structure in accordance with some exemplary embodiments. The package structure may be a Package-on-Package (PoP) structure in accordance with some embodiments. Referring to FIG. 1, carrier 20 is provided, and adhesive layer 22 is formed on carrier 20. Carrier 20 may be a glass carrier, a ceramic carrier, or the like. Adhesive layer 22 may be formed of an adhesive such as a Ultra-Violet (UV) glue.

In some embodiments, polymer layer 24 is formed over adhesive layer 22. Polymer layer 24 may be, for example, polyimide, PolyBenzOxazole (PBO), BenzoCycloButene (BCB), or the like. Plating seed layer 26 is formed on polymer layer 24, for example, through Physical Vapor Deposition (PVD). Seed layer 26 may comprise copper, aluminum, and/or the like. Polymer layer 24 is used as a base film for the plating of seed layer 26. In alternative embodiments, polymer layer 24 is not formed, and seed layer 26 is formed on adhesive layer 22. Photo resist 28 is formed over seed layer 26, and is then patterned. As a result, openings 30 are formed in photo resist 28, through which some portions of seed layer 26 are exposed.

Figure 2:
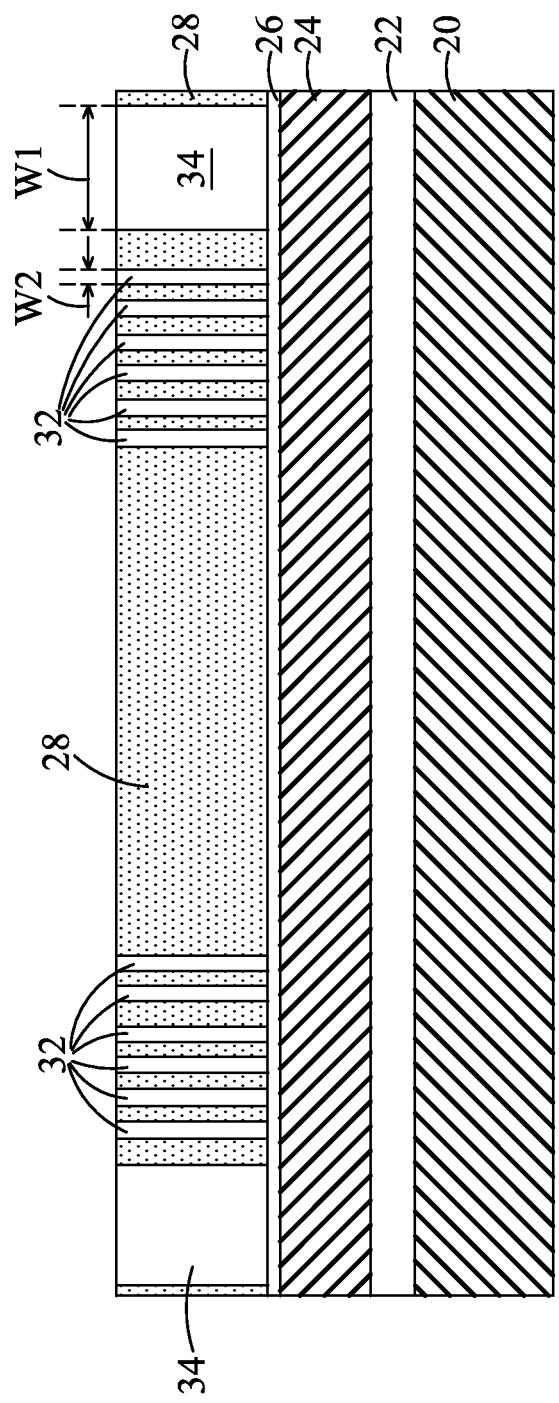

As shown in FIG. 2, metal features 32 and 34 are formed in photo resist 28 through plating, which may be electro plating or electro-less plating. Metal features 32 and 34 are plated on the exposed portions of seed layer 26. Throughout the description, metal features 32 are referred to as Through Assembly Vias (TAVs) 32, and metal features 34 are referred to as bulk metal features 34. The top view shapes of TAVs 32 may be rectangles, squares, circles, or the like. Bulk metal features 34 have much larger sizes than TAVs 32. For example, bulk metal features 34 may have width W1 greater than about 1.25 times, 2.25 times, or 5.0 times, width W2 of TAVs 32. Although not shown, in the top view of the structure in FIG. 2, TAVs 32 and bulk metal features 34 have lengths equal to or greater than widths W1 and W2, respectively. In some embodiments, width W1 is between about 100 μm and about 500 μm, or between about 300 μm and about 400 μm, and width W2 may be between about 400 μm and about 800 μm.

Figure 3:
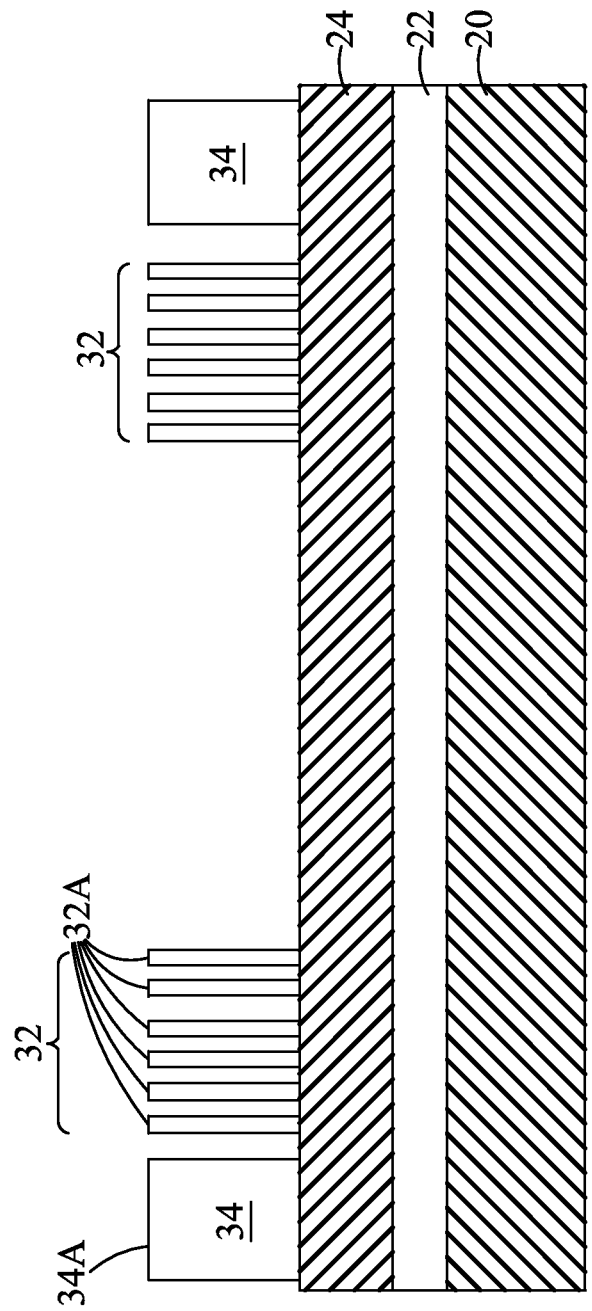

Photo resist 28 is then removed. The portions of seed layer 26 that are covered by photo resist 28 are thus exposed. An etch step is then performed to remove the exposed portions of seed layer 26. The portions of seed layer 26 that are overlapped by TAVs 32 and bulk metal features 34, on the other hand, remain not etched. The resulting structure is shown in FIG. 3. In FIG. 3, seed layer 26 is no longer shown since it may be formed of a material similar to or the same as the respective overlying TAVs 32 and bulk metal features 34, and seed layer 26 is merged with, and becomes portions of the overlying TAVs 32 and bulk metal features 34. TAVs 32 and bulk metal features 34 are formed simultaneously, and hence are formed of same materials, and have a same composition of the materials. In some embodiments, top surfaces 32A of TAVs 32 are level with top surfaces 34A of bulk metal features 34. In alternative embodiments, top surfaces 32A of TAVs 32 are higher than top surfaces 34A of bulk metal features 34.

Figure 4:
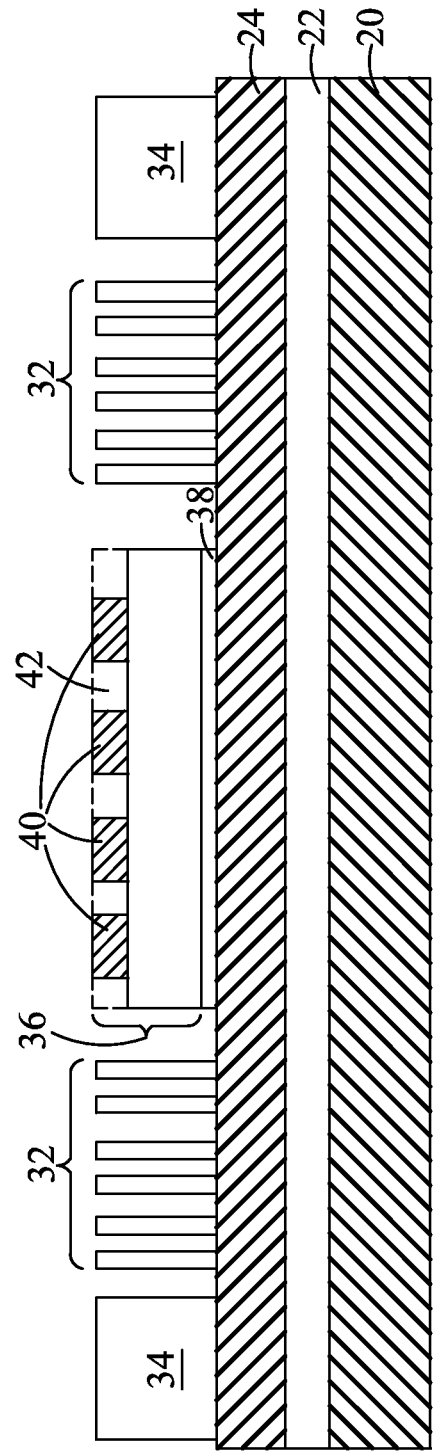

FIG. 4 illustrates the placement of package component 36 on polymer layer 24, for example, using adhesive layer 38. In some embodiments, package component 36 includes a device die, which may be a logic die, a memory die, or the like. The device die may also include active devices (not shown) such as transistors, passive devices (not shown) such as resistors, capacitors, and/or the like. Package component 36 may also be a package that includes a device die, an interposer, a package substrate (not shown), and/or the like.

Electrical connectors 40 (such as copper posts) act as a top portion of package component 36, and are electrically coupled to the devices in package component 36. In some embodiments, electrical connectors 40 protrude above remaining portions of package component 36. In alternative embodiments, dielectric layer 42 is formed at the top surface of package component 36, with electrical connectors 40 having at least lower portions in dielectric layer 42. The top surface of dielectric layer 42 may also be substantially level with the top ends of electrical connectors 40.

Figure 5:
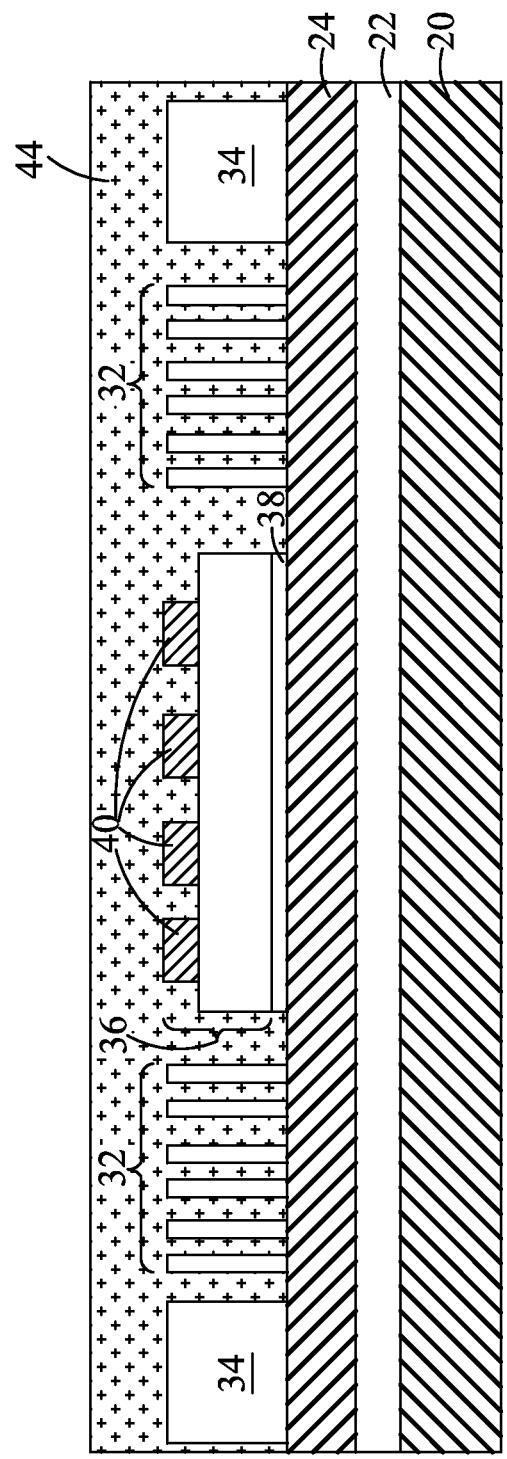
Figure 6:
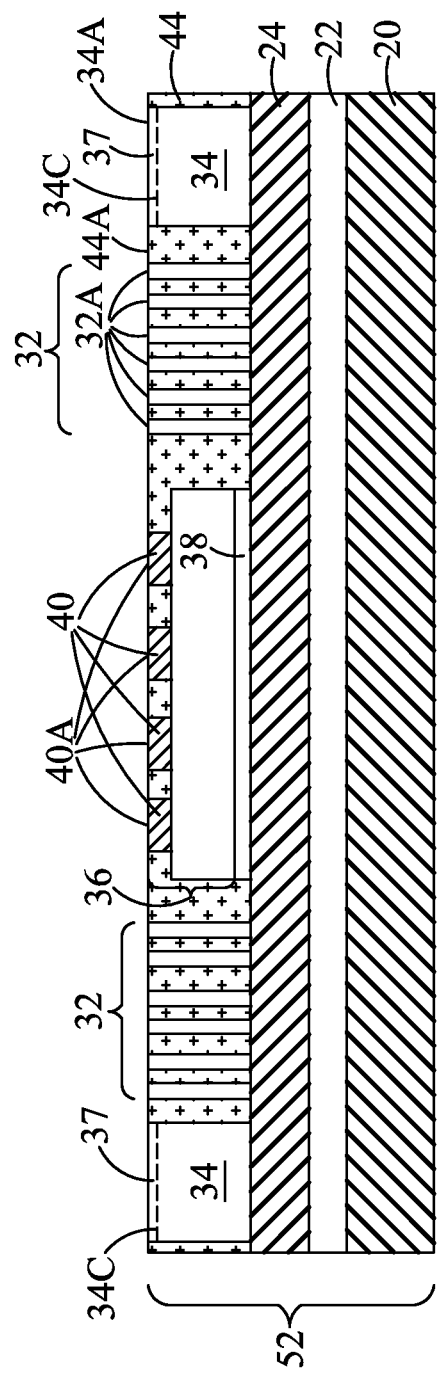

Referring to FIG. 5, polymer 44 is molded on package component 36, TAVs 32, and bulk metal features 34. Polymer 44 fills the gaps between package component 36, TAVs 32, and bulk metal features 34, and may be in contact with polymer layer 24. Polymer 44 may include a molding compound, a molding underfill, or an epoxy. The top surface of polymer 44 is higher than the top ends of electrical connectors 40, TAVs 32, and bulk metal features 34. Next, a thinning step, which may be a grinding step, is performed to thin polymer 44, until electrical connectors 40 and TAVs 32 are exposed. In some embodiments, the top surfaces of bulk metal features 34 are exposed. The resulting structure is shown in FIG. 6. Due to the step of thinning, the top ends/surfaces 32A of TAVs 32 and the top ends 34A of bulk metal features 34 are substantially level with the ends/surfaces 40A of electrical connectors 40, and are substantially level with top surface 44A of polymer 44. In alternative embodiments, after the thinning step, the top ends of bulk metal features 34 are not exposed, and are covered by a remaining layer of polymer 44. In these embodiments, dotted lines 34C represent the positions of the top ends of bulk metal features 34, and regions 37 may be filled with polymer 44. Throughout the description, the structure shown in FIG. 6 is referred to as composite wafer 52, which may have a top view shape of a silicon wafer and a size close to a silicon wafer.

Figure 7:
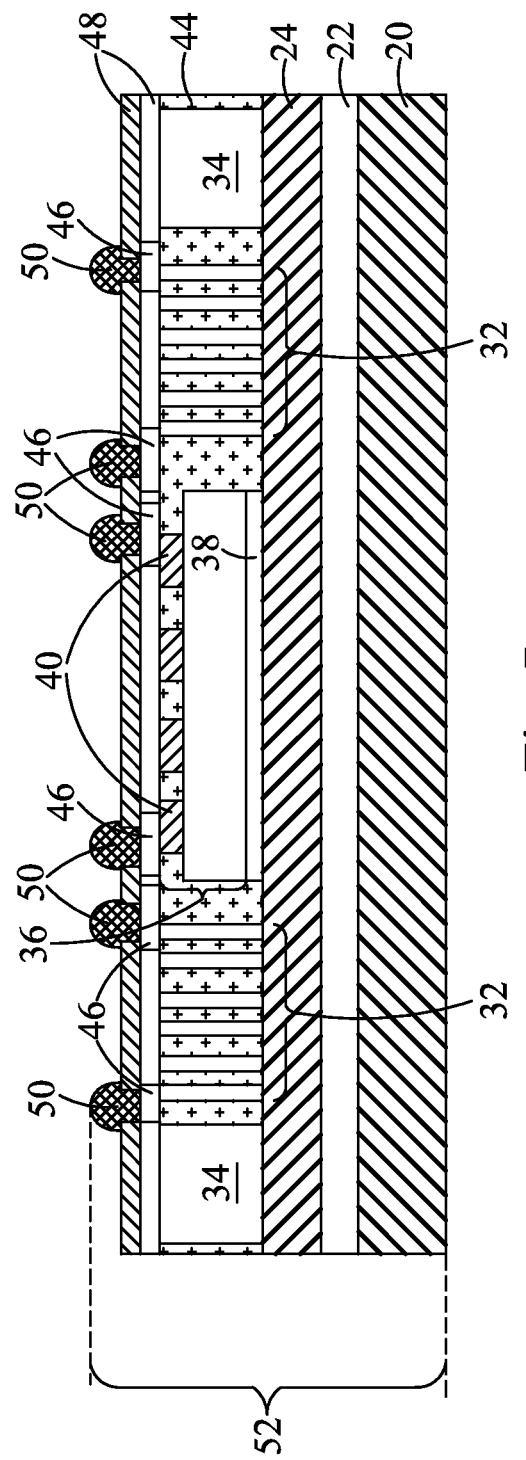

FIG. 7 illustrates the formation of Redistribution Lines (RDLs) 46, dielectric layers 48, and electrical connectors 50. RDLs 46 are formed over polymer 44 to connect to electrical connectors 40 and TAVs 32, and may, or may not, interconnect electrical connectors 40 with TAVs 32. In some embodiments, RDLs 46 are formed by depositing a metal layer(s), and then patterning the metal layer(s). In alternative embodiments, RDLs 46 and dielectric layers 48 are formed using damascene processes. RDLs 46 may comprise aluminum, copper, tungsten, and/or alloys thereof.

FIG. 7 also illustrates the formation of electrical connectors 50. In some exemplary embodiments, the formation of connectors 50 includes placing solder balls on the exposed portions of RDLs 46, and then reflowing the solder balls. In alternative embodiments, the formation of connectors 50 includes performing a plating step to form solder regions on RDLs 46, and then reflowing the solder regions. Connectors 50 may also include metal pillars, or metal pillars and solder caps, which may also be formed through plating.

Figure 8:
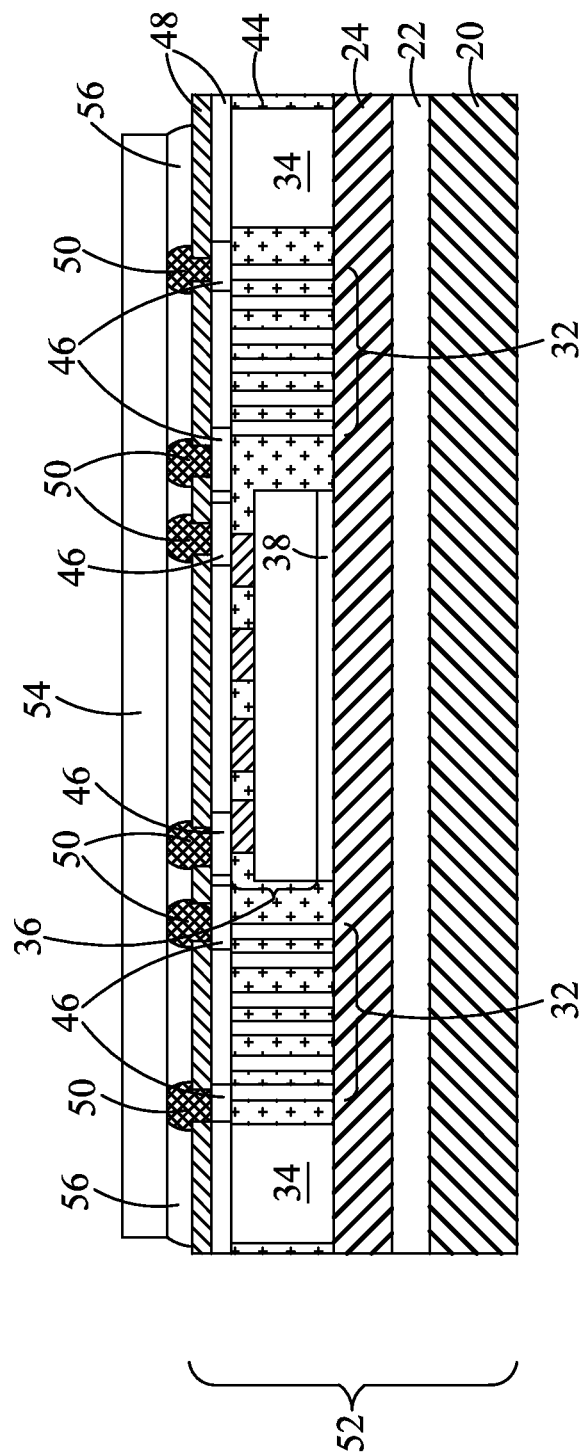
Figure 9A:
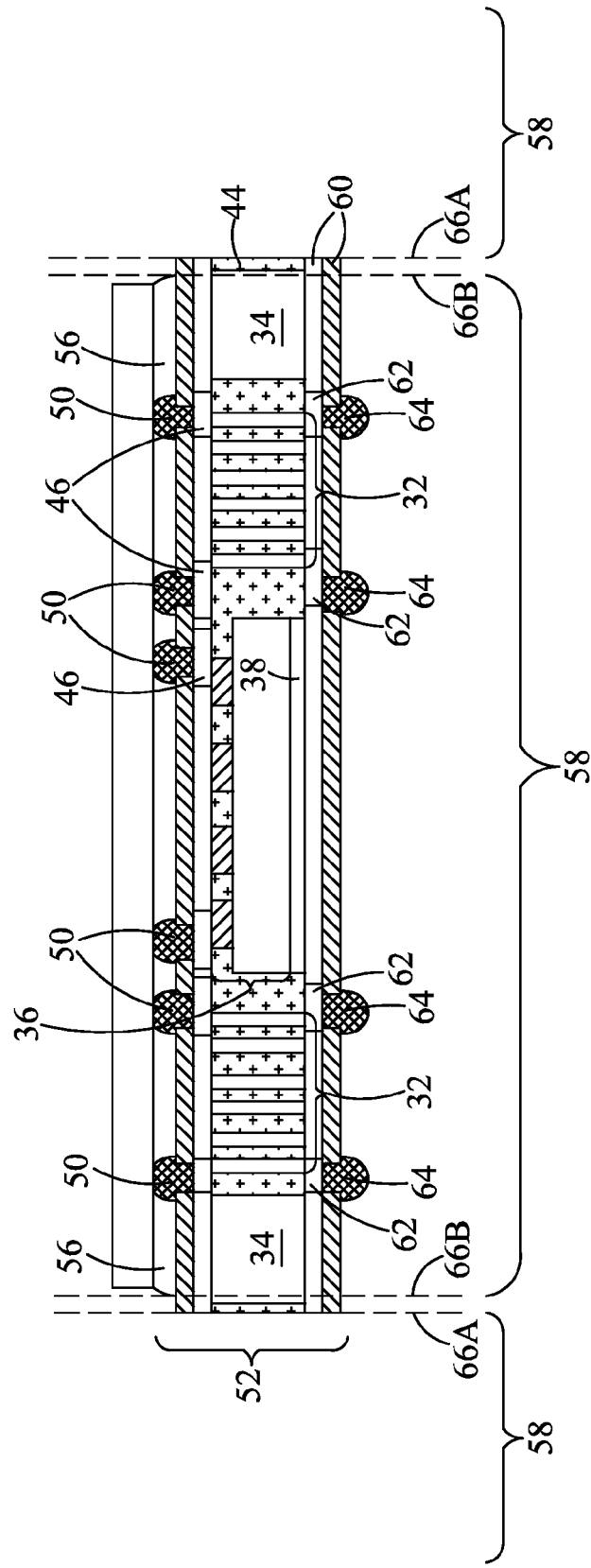
FIG. 9B illustrates a top view of the structure shown in FIG. 9A.

FIG. 8 illustrates the bonding of top package component 54 to connectors 50. Underfill 56 is dispensed into the space between top package component 54 and bottom package 58. Top package component 54 may be a package, a device die, or the like. In subsequent process steps, carrier 20, adhesive layer 22, polymer layer 24 are removed, and the resulting structure is shown in FIG. 9A. RDLs 62 and connectors 64, which may be essentially the same as RDLs 46 and connectors 50, may be formed on the bottom side of, and electrically connected to, TAVs 32. Dielectric layers 60 may also be formed on the bottom side of TAVs 32.

The resulting structure is sawed into packages 58 along scribe lines 66A or 66B, wherein each of the packages 58 include top package component 54 bonded to bottom package 58. Bottom package 58 includes package component 36, TAVs 32, bulk metal feature 34, polymer 44, RDLs 46, dielectric layers 48, RDLs 62 and connectors 64. In some embodiments, the sawing is performed along scribe lines 66A, and hence bulk metal features 34 are slightly spaced apart from edges 58B of package 58. In alternative embodiments, the sawing is performed along scribe lines 66B, and hence the edges of bulk metal features 34 are aligned to the respective edges 58B of package 58.

In the formation of RDLs 46, composite wafer 52 in FIGS. 7 and 8 may be picked up and transferred, for example, to a chuck table (not shown). The tool used to pick up and transfer composite wafer 52 may be a suction head (not shown) that forms a vacuum with the bottom surface of carrier 20. Furthermore, the chuck table may secure composite wafer 52 through vacuum. This requires the warpage of composite wafer 52 to be low. Since polymer 44 may have a Coefficient of Thermal Expansion (CTE) significantly smaller than the CTE of carrier 20, the warpage in composite wafer 52 may be significant. Bulk metal features 34, on the other hand, has a CTE greater than the CTE of carrier 20. The high CTE of bulk metal features 34 compensates for the low CTE of polymer 44, and hence brings the overall CTE of the combined structure including polymer 44 and bulk metal features 34 closer to the CTE of carrier 20. The warpage of composite wafer 52 is thus reduced, and it is easier to perform the steps shown in FIGS. 7 and 8.

Figure 9B:
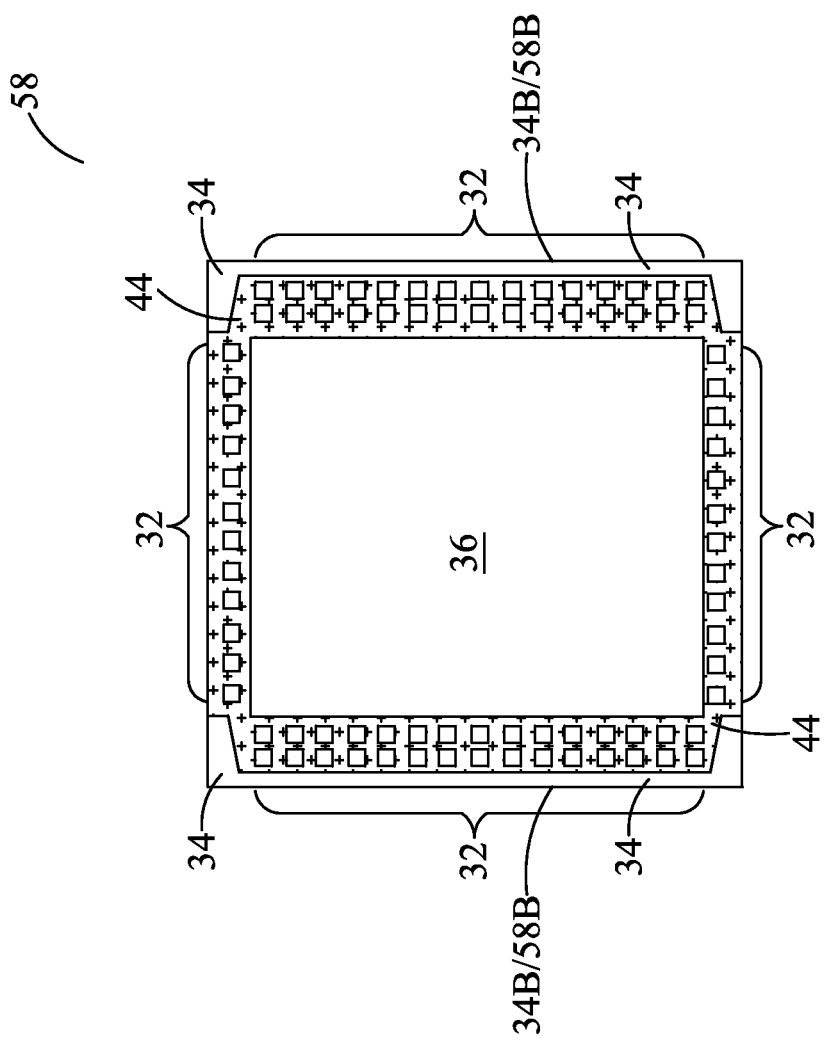

FIG. 9B illustrates a top view of package 58, which includes package component 36, polymer 44, TAVs 32, and bulk metal features 34. In some embodiments, bulk metal features 34 are formed close to edges 58B of package 58. One or more edge 34B of bulk metal features 34 may also be aligned to the respective edge 58B of package 58. In the illustrated embodiments, bulk metal features 34 include two portions, each extending along one edge 58B of package 58. The length of bulk metal features 34 may be close to or equal to the length of the respective edge 58B of package 58. In alternative embodiments, package 58 may include one, three, four, or more bulk metal features 34. Some of bulk metal features 34 may also be formed away from the edges of package 58.

Bulk metal features 34 may be dummy features, which are electrically floating, and are disconnected from TAVs 32 and RDLs 46 (FIG. 9A). Also, bulk metal features 34 may be physically separated from other integrated circuits and RDLs 46. For example, the top and the bottom surfaces of bulk metal features 34 may be in contact with dielectric materials. Some of bulk metal features 34 may also be used as ground connections, which are grounded.

The total top-view area of bulk metal features 34 in package 58 is greater than the total top-view area of TAVs 32, and may be greater than two times, four time, or more, of the total top-view area of TAVs 32. The total top-view area of bulk metal features 34 in package 58 may also be greater than about 5 percent, greater than about 10 percent, or higher, of the top-view area of package 58.

FIGS. 10 through 16 illustrate cross-sectional views of intermediate stages in the formation of a package structure in accordance with alternative embodiments. Unless specified otherwise, the materials and formation methods of the components in these embodiments are essentially the same as the like components, which are denoted by like reference numerals in the embodiments shown in FIGS. 1 through 9B. The details regarding the formation process and the materials of the components shown in FIGS. 10 through 16 may thus be found in the discussion of the embodiment shown in FIGS. 1 through 9B.

Figure 10:
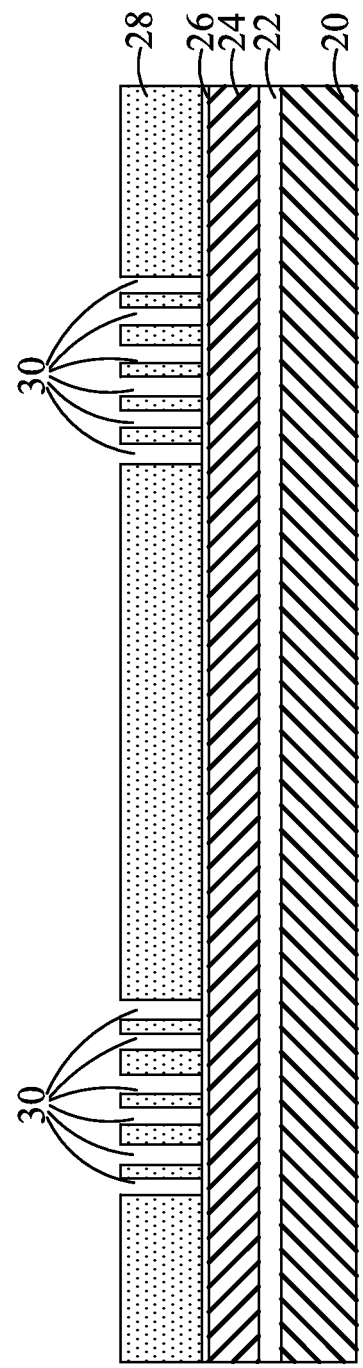
FIGS. 10 through 16 are cross-sectional views of intermediate stages in the manufacturing of a package comprising a device die molded in a polymer in accordance with alternative exemplary embodiments, wherein a bulk metal feature is formed in the polymer through placement.
Figure 11:
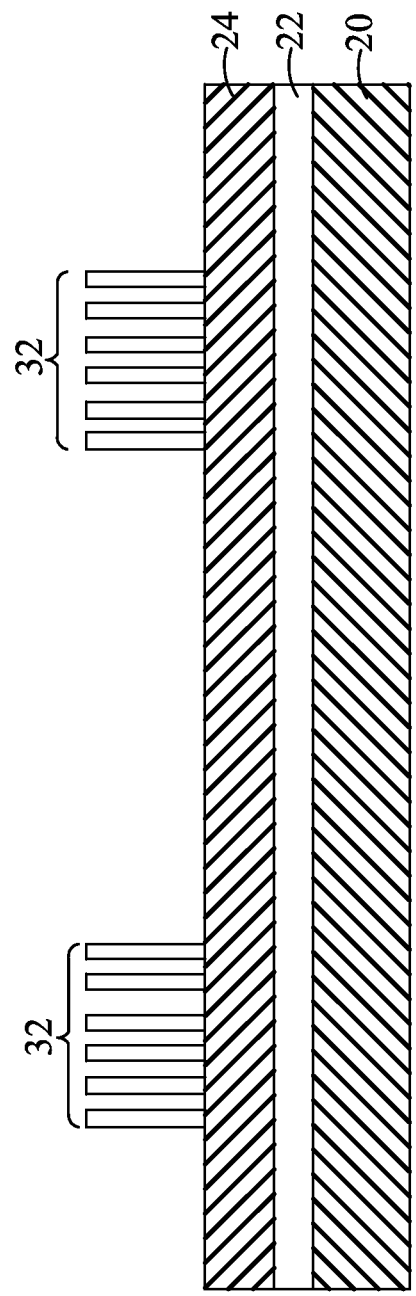

Referring to FIG. 10, carrier 20 is provided, and adhesive layer 22, polymer layer 24, and seed layer 26 are formed over carrier 20. Photo resist 28 is then formed and patterned. Next, as shown in FIG. 11, TAVs 32 are formed, followed by the removal of photo resist 28 and the etching of seed layer 26 (FIG. 10). Again, in the resulting structure, the remaining portions of seed layer 26 are considered as portions of TAVs 32.

Figure 12A:
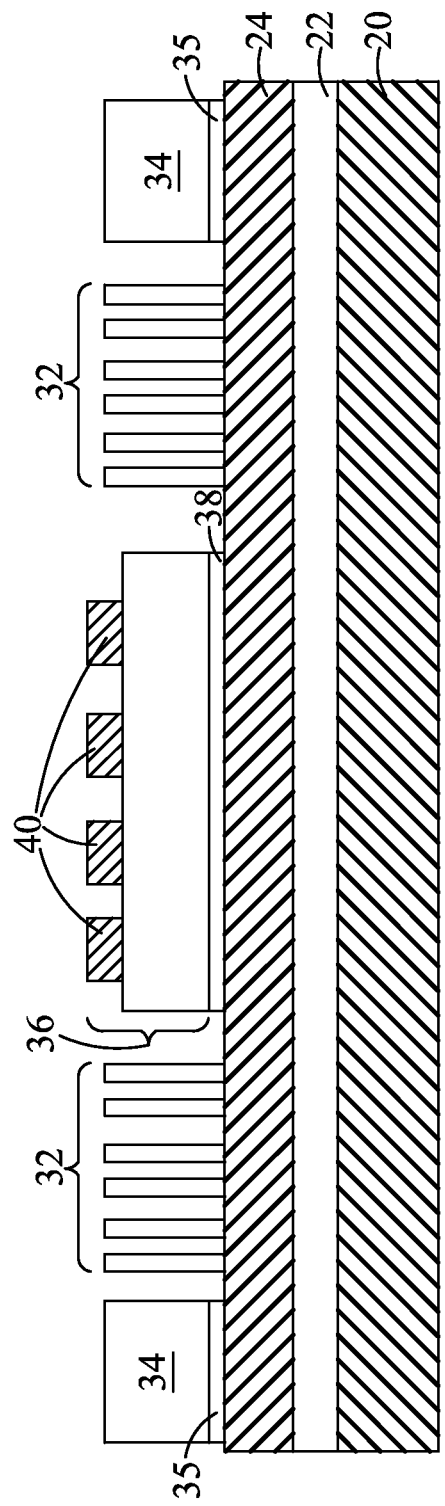
FIG. 12B illustrates a top view of the structure in FIG. 11A.
Figure 12B:
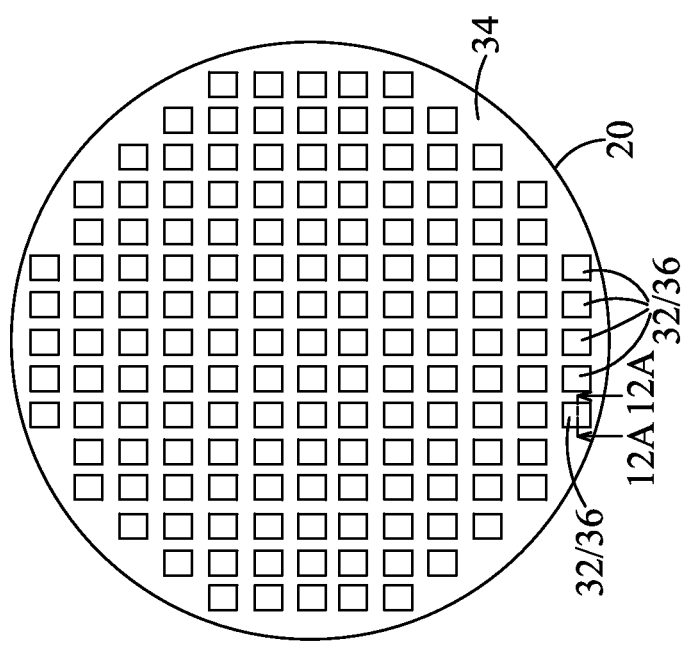
Figure 13:
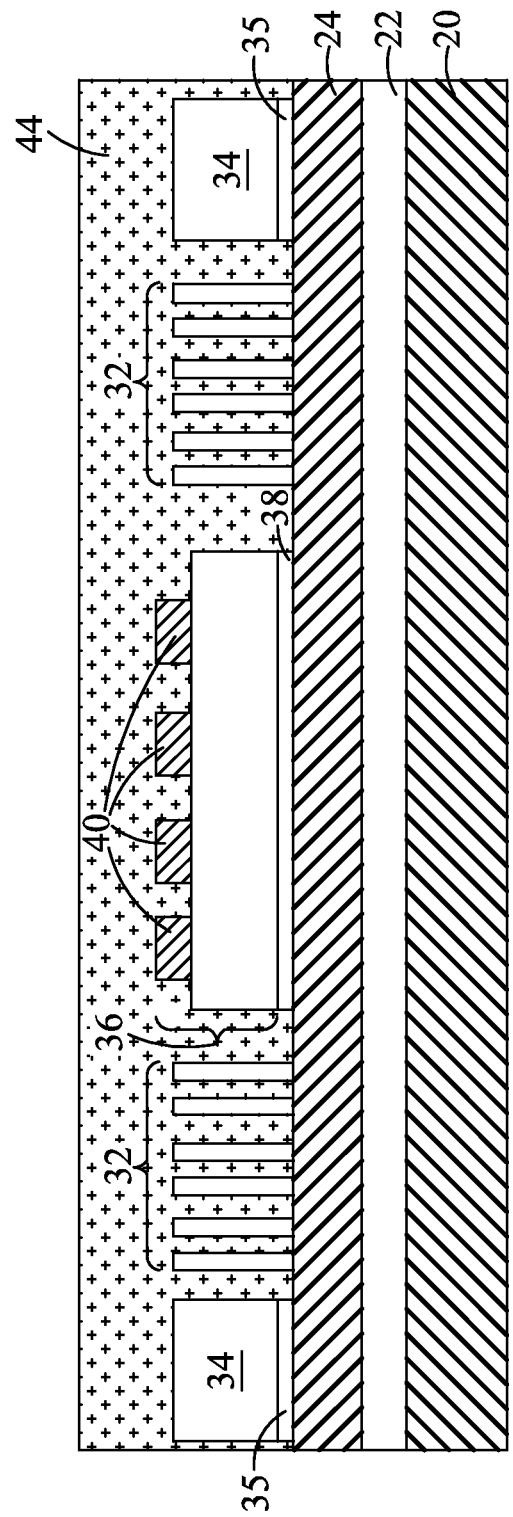
Figure 14:
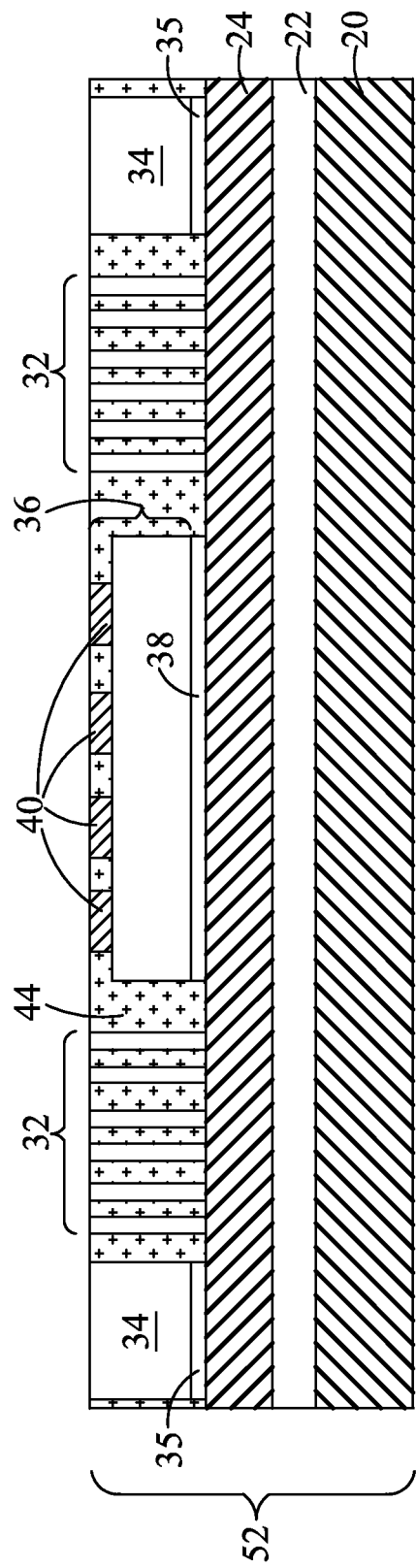

In FIG. 12A, bulk metal feature 34, which is pre-formed, is adhered on polymer layer 24 through adhesive 35. TAVs and bulk metal feature 34 may be formed of a same material and have a same composition, or may be formed of different materials. FIG. 12B illustrates a top view of the structure in FIG. 12A, wherein the cross-sectional view in FIG. 12A is obtained from the plane crossing line 12A-12A in FIG. 12B. As shown in FIG. 12B, bulk metal feature 34 may have a size close to the size of carrier 20, which includes a plurality of package components 36 thereon. The rectangles in FIG. 12B represent package components 36 and TAVs 32. Bulk metal feature 34 also continuously extends between package components 36 and TAVs 32.

Figure 15:
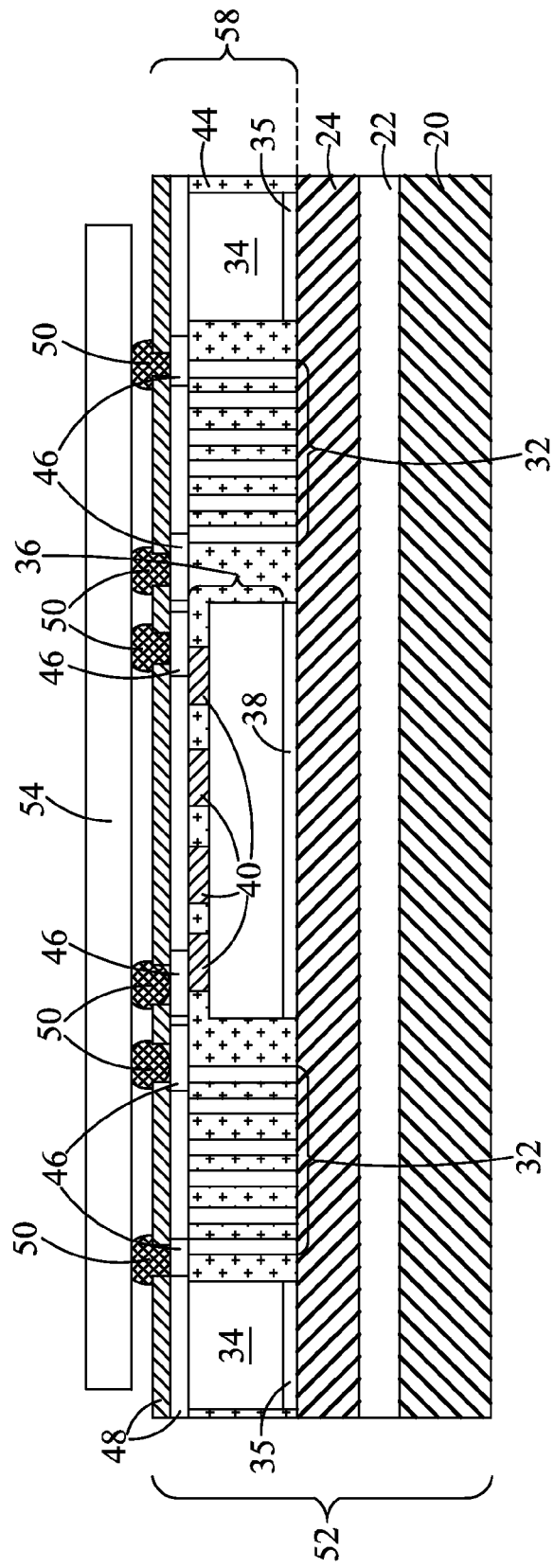
Figure 16:
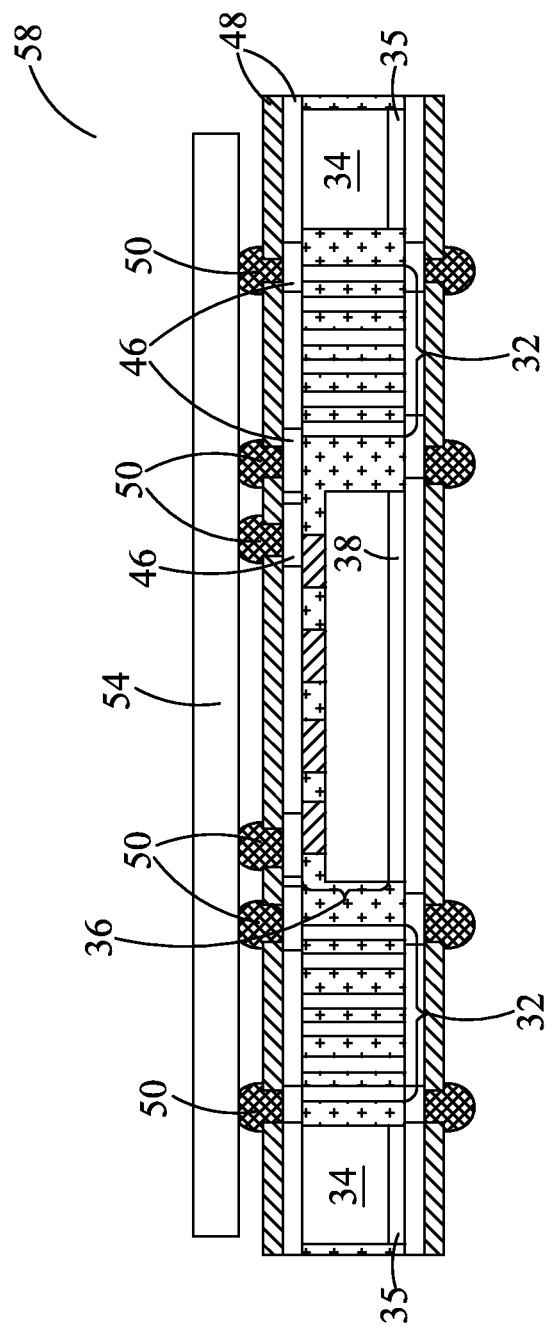

The remaining process steps in accordance with these embodiments are shown in FIGS. 13 through 16. The details for the subsequent process steps are essentially the same as in FIGS. 5 through 9B, and hence are not repeated herein. FIG. 16 illustrates an exemplary resulting package 58.

Through the formation of bulk metal features 34, the warpage of composite wafer 52 (FIGS. 8 and 15) may be significantly reduced. In simulations, when no bulk metal features are formed, the warpage of the respective composite wafer is about 1.55 μm. When the embodiment shown in FIG. 8 is formed, the warpage of composite wafer 52 is reduced to about 1.12 μm. When the embodiment shown in FIG. 15 is formed, the warpage of composite wafer 52 is reduced to about 1.39 μm. With the reduction in the warpage, the process may be performed with reduced process difficulty.

In accordance with embodiments, a device includes a polymer, a device die in the polymer, and a plurality of TAVs extending from a top surface to a bottom surface of the polymer. A bulk metal feature is located in the polymer and having a top-view size greater than a top-view size of each of the plurality of TAVs. The bulk metal feature is electrically floating. The polymer, the device die, the plurality of TAVs, and the bulk metal feature are portions of a package.

In accordance with other embodiments, a device includes a polymer and a device die in the polymer. A plurality of TAVs extends from a top surface to a bottom surface of the polymer. A bulk metal feature is in the polymer, wherein the polymer, the device die, the plurality of TAVs, and the bulk metal feature are comprised in a package. An edge of the bulk metal feature is aligned to an edge of the package.

In accordance with yet other embodiments, a method includes forming a plurality of TAVs over a carrier, and placing a device die over the carrier, wherein the device die includes electrical connectors. The plurality of TAVs, the device die, and a bulk metal feature are molded in a polymer, wherein the bulk metal feature has a top-view size greater than a top-view size of each of the plurality of TAVs. The polymer is thinned to expose the plurality of TAVs and the electrical connectors of the device die. Redistribution Lines are formed over and connected to the plurality of TAVs and the electrical connectors of the device die. The bulk metal feature may be plated or adhered over the carrier.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the present disclosure.

What is claimed is:

1. A package comprising:
   a polymer;
   a device die in the polymer;
   a plurality of Through Assembly Vias (TAVs) extending from a top surface to a bottom surface of the polymer; and
   a first bulk metal feature in the polymer and having a top-view size greater than a top-view size of each of the plurality of TAVs.

2. The package of claim 1, wherein the first bulk metal feature is adjacent to an edge of the package.

3. The package of claim 2, wherein an edge of the first bulk metal feature is aligned to the edge of the package.

4. The package of claim 2, wherein a total top-view area of all bulk metal features in the package is greater than about 5 percent of a total top-view area of the package.

5. The package of claim 1 further comprising a second bulk metal feature in the polymer, wherein the second bulk metal feature is electrically grounded.

6. The package of claim 1, wherein top ends of the plurality of TAVs are substantially level with top ends of electrical connectors of the device die and a top end of the first bulk metal feature, and wherein bottom ends of the plurality of TAVs are level with a bottom end of the first bulk metal feature.

7. The package of claim 1, wherein top ends of the plurality of TAVs are substantially level with top ends of electrical connectors of the device die, and a top end of the first bulk metal feature is lower than the top ends of the plurality of TAVs, and wherein bottom ends of the plurality of TAVs are level with a bottom end of the first bulk metal feature.

8. The package of claim 1 further comprising:
   a carrier under the device die and the polymer; and
   a plurality of device dies in the polymer, wherein the top-view size of the first bulk metal feature is substantially equal to a top-view size of the carrier, and wherein the first bulk metal feature continuously extends between the plurality of device dies.

9. A package comprising:
   a polymer;
   a device die in the polymer;
   a plurality of Through Assembly Vias (TAVs), each extending from a top surface to a bottom surface of the polymer;
   a first bulk metal feature in the polymer, wherein an edge of the first bulk metal feature is aligned to an edge of the package; and
   an adhesive underlying and contacting the first bulk metal feature, wherein no adhesive is underlying and contacting plurality of TAVs.

10. The package of claim 9, wherein top ends of the plurality of TAVs, top ends of electrical connectors of the device die, and a top end of the first bulk metal feature are substantially level with each other, and wherein bottom ends of the plurality of TAVs and a bottom end of the first bulk metal feature are substantially level with each other.

11. The package of claim 9, wherein the first bulk metal feature is electrically floating, and wherein the device further comprises a second bulk metal feature in the polymer, and wherein the second bulk metal feature is electrically grounded.

12. The package of claim 9 further comprising:
   a carrier under the device die and the polymer; and
   a plurality of device dies in the polymer, wherein the first bulk metal feature continuously extends between the plurality of device dies.

13. The package of claim 9, wherein a total top-view area of all bulk metal features in the package is greater than about 5 percent of a total top-view area of the package.

14. The package of claim 9, wherein the plurality of TAVs and the first bulk metal feature have a same composition.

15. A method comprising:
   forming a plurality of Through Assembly Vias (TAVs) over a carrier;
   placing a device die over the carrier, wherein the device die comprises electrical connectors;
   molding the plurality of TAVs, the device die, and a bulk metal feature in a polymer, wherein the bulk metal feature has a top-view size greater than a top-view size of each of the plurality of TAVs;
   thinning the polymer to expose the plurality of TAVs and the electrical connectors of the device die; and
   forming Redistribution Lines (RDLs) over and connected to the plurality of TAVs and the electrical connectors of the device die.

16. The method of claim 15, wherein after the thinning the polymer, the bulk metal feature is exposed.

17. The method of claim 15, wherein after the thinning the polymer, the bulk metal feature is covered by a layer of the polymer.

18. The method of claim 15 further comprising:
   before the step of molding the plurality of TAVs, the device die, and the bulk metal feature in the polymer, forming a patterned photo resist over the carrier;
   simultaneously plating the plurality of TAVs and the bulk metal feature in openings in the patterned photo resist; and
   removing the patterned photo resist, wherein the step of placing the device die is performed after the patterned photo resist is removed.

19. The method of claim 15 further comprising:
   before the step of molding the plurality of TAVs, the device die, and the bulk metal feature in the polymer, forming a patterned photo resist over the carrier;
   plating the plurality of TAVs in openings in the patterned photo resist;
   removing the patterned photo resist; and
   after the patterned photo resist is removed, adhering the bulk metal feature over the carrier.

* * * * *